(12) United States Patent
Agrawal et al.

(10) Patent No.: US 11,776,606 B2
(45) Date of Patent: *Oct. 3, 2023

(54) SENSING SCHEME FOR STT-MRAM USING LOW-BARRIER NANOMAGNETS

(71) Applicant: GLOBALFOUNDRIES U.S. INC., Santa Clara, CA (US)

(72) Inventors: Amogh Agrawal, West Lafayette, IN (US); Ajey Poovannummoottil Jacob, Watervliet, NY (US); Bipul C. Paul, Mechanicville, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/365,481

(22) Filed: Jul. 1, 2021

(65) Prior Publication Data

US 2021/0327487 A1 Oct. 21, 2021

Related U.S. Application Data

(63) Continuation of application No. 16/508,940, filed on Jul. 11, 2019, now Pat. No. 11,087,814.

(51) Int. Cl.
*G11C 11/16* (2006.01)
(52) U.S. Cl.
CPC ........ *G11C 11/1673* (2013.01); *G11C 11/161* (2013.01); *G11C 11/1659* (2013.01); *G11C 11/1697* (2013.01)

(58) Field of Classification Search
CPC .............. G11C 11/1673; G11C 11/161; G11C 11/1659; G11C 11/1697
See application file for complete search history.

(56) References Cited

U.S. PATENT DOCUMENTS

| | | | |
|---|---|---|---|
| 9,025,367 B1 | 5/2015 | Lin | |
| 11,087,814 B2 * | 8/2021 | Agrawal | ............. G11C 11/1697 |
| 2013/0076550 A1 * | 3/2013 | Marukame | .............. H01L 43/08 341/158 |
| 2015/0146481 A1 * | 5/2015 | Lin | .......................... G11C 7/14 365/158 |
| 2016/0111071 A1 * | 4/2016 | Ishizu | ...................... G10H 1/16 381/61 |

OTHER PUBLICATIONS

W. Xu, T. Zhang and Y. Chen, "Design of Spin-Torque Transfer Magnetoresistive RAM and CAM/TCAM with High Sensing and Search Speed," IEEE Transactions on Very Large Scale Integration (VLSI) Systems, vol. 18, No. 1, pp. Jan. 2010, 9 pages.
Quang-Kien Trinh, "Dynamic Reference Voltage Sensing Scheme for Read Margin Improvement in STT-MRAMs", IEEE Transactions on Curcuits and Systems-I: Regular Papers, vol. 65, No. 4, Apr. 2018, 10 pages.

(Continued)

*Primary Examiner* — Jay W. Radke
(74) *Attorney, Agent, or Firm* — David Cain; Andrew M. Calderon; Calderon Safran & Cole, P.C.

(57) ABSTRACT

The present disclosure relates to a structure including a non-fixed read-cell circuit configured to switch from a first state to a second state based on a state of a memory cell to generate a sensing margin.

19 Claims, 5 Drawing Sheets

(56) References Cited

OTHER PUBLICATIONS

Dietmar Gogl et al.,"A 16-Mb MRAM Featuring Bootstrapped Write Drivers", IEEE Journal of Solid-State Circuits,vol. 40, No. 4, Apr. 2005, 7 pages.
Quang-Kien Trinh.,"Time-Based Sensing for Reference-Less and Robust Read in STT-MRAM Memories", IEEE Transactions on Circuits and Systems-I: Regular Papers, vol. 65. No. 10, Oct. 2018, 11 pages.

\* cited by examiner

SENSING SCHEME FOR STT-MRAM USING LOW-BARRIER NANOMAGNETS

FIELD OF THE INVENTION

The present disclosure relates to a sensing scheme, and more particularly, to a circuit and a method for a sensing scheme for a spin transfer torque magnetoresistive random access memory (STT-MRAM) using low-barrier nanomagnets.

BACKGROUND

Magnetoresistive random access memory (MRAM) includes an electrically connected array of magnetoresistive memory elements, referred to as magnetic tunnel junctions (MTJs). Each magnetic tunnel junction includes a free layer and fixed/reference layer that each includes a magnetic material layer. A non-magnetic insulating tunnel barrier separates the free and fixed/reference layers. The free layer and the reference layer are magnetically de-coupled by the tunnel barrier. The free layer has a variable magnetization direction, and the reference layer has an invariable magnetization direction.

A magnetic tunnel junction stores information by switching the magnetization state of the free layer. When the magnetization direction of the free layer is parallel to the magnetization direction of the reference layer, the magnetic tunnel junction is in a low resistance state. Conversely, when the magnetization direction of the free layer is antiparallel (non-parallel) to the magnetization direction of the reference layer, the magnetic tunnel junction is in a high resistance state. The difference in resistance of the magnetic tunnel junction may be used to indicate a logical '1' or '0', thereby storing a bit of information. The tunnel magnetoresistance (TMR) of a magnetic tunnel junction determines the difference in resistance between the high and low resistance state. A relatively high difference between the high and low resistance state is desirable to facilitate a deterministic read operation in the MRAM.

Conventional sensing schemes use a fixed reference cell, with a fixed reference resistance, typically between the high resistance state and the low resistance state of the MRAM. However, MRAM suffers from low TMR and low sensing margin, and precise reference generation can be difficult and may require extra circuitry given the process variations and low sensing margin. In addition, very sensitive sense amplifiers and a peripheral circuit is required given the process variations and low sensing margin.

SUMMARY

In an aspect of the disclosure, a structure includes a non-fixed read-cell circuit configured to switch from a first state to a second state based on a state of a memory cell to generate a sensing margin.

In another aspect of the disclosure, a circuit includes a memory cell, an access transistor which is gated with a wordline and is connected to the memory cell, an operational amplifier which has a first input connected to the memory cell through a bitline and a second input connected to a voltage bias, and a read magnetic tunnel junction (MTJ) element which has a first terminal connected to the first input of the operational amplifier and a second terminal connected to an output of the operational amplifier.

In another aspect of the disclosure, a method includes resetting a read magnetic tunnel junction (MTJ) element of a circuit to a first state, which is a parallel state before a read cycle, applying a read voltage to an access transistor connected to a memory cell in the circuit during the read cycle, switching the read MTJ element from the first state to a second state, which is an anti-parallel state, based on a state of the memory cell, and sensing an output voltage of the circuit based on the switched read MTJ element.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a sensing scheme, and more particularly, to a circuit and a method for a sensing scheme for a spin transfer torque magnetoresistive random access memory (STT-MRAM) using low-barrier nanomagnets. In particular, the present disclosure uses a non-volatile memory (NVM) sensing scheme with a low energy barrier (Eb) sensing magnetic tunnel junction (MTJ) in a peripheral circuit to a memory array. Accordingly, the present disclosure uses a sensing structure with a low-barrier read-MTJ for sensing in a magnetoresistive random access memory (MRAM) array.

In conventional systems, fixed reference cells or fixed voltage reference signals are used for sensing the state of the memory cell. Given the low TMR and low sensing margin of MRAM technology, these systems are susceptible to process variations. Further, precise reference generation is difficult, and requires complicated control circuitry. Recently, time-based sensing schemes have been proposed to overcome these issues. However, such systems require complicated control circuitry with a voltage to time converter (VTC) circuitry which includes analog elements, a sample and hold circuitry, started inverter biasing, an input pulse generator, and a programmable delay. Conventional systems can also include a single ended sensing scheme and a reference with a sense amplifier sensing scheme. In contrast to conventional systems, the present disclosure does not require any VTC circuitry (i.e., a VTC operation is simply done by a read-MTJ) and uses smaller read-MTJ switching characteristics to sense a bitcell, which is designed to conditionally switch from one state to the other depending on the data stored in the memory cell which needs to be sensed, thereby enhancing the sensing margin to sense the memory cell. In the present disclosure, the higher sensing margin can be accomplished through a low-barrier read-MTJ. Further, the present disclosure also has a simplified peripheral sensing circuitry.

Figures 1A, 1B, 1C:
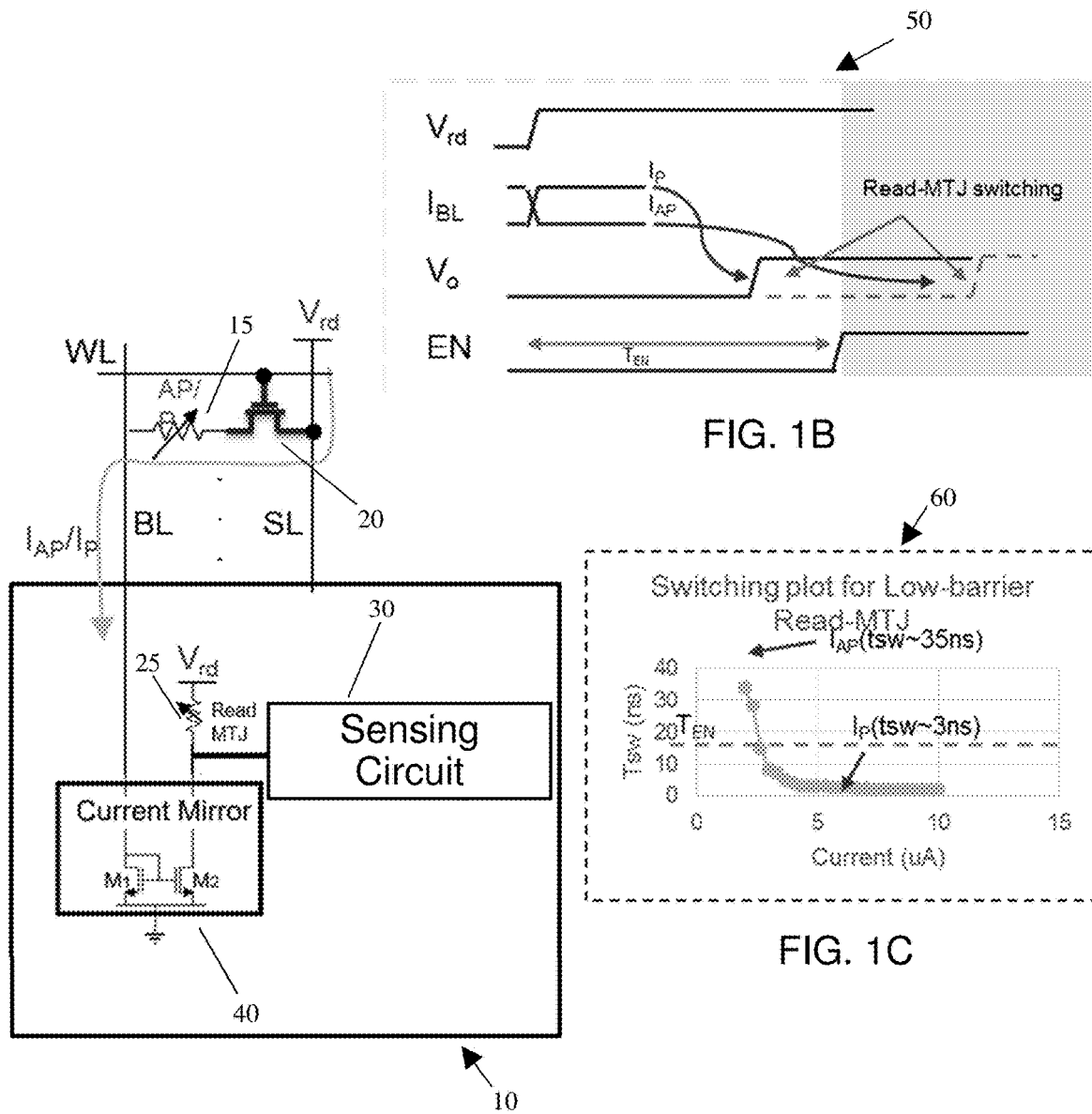
FIG. 1A shows a proposed sensing scheme using the low-barrier read-MTJ structure in accordance with aspects of the present disclosure.
FIG. 1B shows a timing diagram of the read operation of the proposed sensing scheme using the low-barrier read-MTJ structure in accordance with aspects of the present disclosure.
FIG. 1C shows a graph of the switching characteristics of the low barrier read MTJ structure in accordance with aspects of the present disclosure.

FIG. 1A shows a sensing scheme using the low-barrier read-MTJ structure in accordance with aspects of the present disclosure. In FIG. 1A, the memory element to be sensed 15 and the corresponding access transistor 20 are connected to the sensing structure 10 through the BL. The sensing structure 10 consists of the low-barrier read-MTJ element 25 (i.e., non-fixed read-cell circuit), a sensing circuit 30, and a current mirror 40. The access transistor 20 is a NMOS transistor with a gate connected to a wordline WL, a drain connected to a read voltage Vrd, and a source connected to the memory cell 15. The memory cell 15 can be a magnetoresistive random access memory magnetic tunnel junction (MRAM MTJ).

In embodiments, the read MTJ element 25 can have specific characteristics, such as slow switching during low current and fast switching during high current. The read MTJ element 25 can also be reset to a parallel state (i.e., P state) before a read cycle. Further, the read MTJ element 25 has a low energy barrier (i.e., low EB) such that the read MTJ element 25 can switch at a low read current. Further, the memory cell 15 can have an enhanced sensing margin. The read MTJ element 25 is connected between a power supply voltage VDD and a current mirror 40. The current mirror 40 receives a bitline current from a bitline BL. Lastly, the sensing circuit 30 is connected between the read MTJ element 25 and the current mirror 40.

In operation of the low barrier MTJ structure of FIG. 1A, the read voltage Vrd can be applied to the access transistor 20 and the current $I_{BL}$ (which can be high depending on whether the state of the memory element 15 is in a parallel state ($I_P$) or low if the memory element 15 is in an antiparallel (non-parallel) state ($I_{AP}$)) flows through the memory cell 15 and towards the current mirror 40 (see the current direction as represented by the gray arrow). The current mirror 40 can replicate and pass the current $I_{BL}$ to the read MTJ element 25. The read MTJ element 25 can either switch or not switch depending on whether the current $I_{BL}$ is in a parallel state ($I_P$) or an antiparallel state ($I_{AP}$). For example, the read MTJ element 25 switches slowly at a low current (i.e., antiparallel state ($I_{AP}$)) and switches quickly at a fast current (i.e., parallel state ($I_P$)).

FIG. 1B shows a timing diagram 50 of the read operation of the proposed sensing scheme using the low-barrier read-MTJ structure of FIG. 1A in accordance with aspects of the present disclosure. In FIG. 1B, when the read voltage Vrd is enabled, a current passes through the memory cell through the access transistor and into the BL. The BL current ($I_{BL}$) can have a high value ($I_P$) if the memory cell stores a parallel state, or a low value ($I_{AP}$) if the memory cell stores an anti-parallel state. Since this current is reflected into the read-MTJ through the current mirror, the read-MTJ switches much faster if $I_P$ flows through it, than if $I_{AP}$ flows through it. This is shown in the figure through the timing of Vo, which switches from '0' to '1' if the read-MTJ switches. The node Vo is connected to the sensing circuit to determine the memory cell state, achieving a higher sensing margin. In FIG. 1B, the enable signal EN rises or is driven from '0' to '1' after a time $T_{EN}$. The time $T_{EN}$ is designed such that the read-MTJ will switch within that time frame only if $I_P$ passes through it, and read-MTJ will not switch in that time frame if $I_{AP}$ passes through it.

FIG. 1C shows a graph 60 of the switching characteristics of the low-barrier read-MTJ structure of FIG. 1A in accordance with aspects of the present disclosure. In FIG. 1C, the switching time (Tsw) is shown on the y-axis and the bitline current ($I_{BL}$) is shown on the x-axis. As shown in FIG. 1C, the time required for switching the low-barrier read-MTJ at a low current (i.e., when the bitline current $I_{BL}$ is between 0-3 µA and at an antiparallel state ($I_{AP}$)) is approximately 35 nanoseconds. Further, the time required for switching the low-barrier read-MTJ at a high current (i.e., when the bitline current $I_{BL}$ is between 5-7 µA and at a parallel state ($I_P$)) is approximately 3 nanoseconds. The times described for switching the low-barrier read-MTJ at a low current (i.e., approximately 35 nanoseconds) and a high current (i.e., approximately 3 nanoseconds) are non-limiting examples of the present disclosure, and can be different times based on modified circuit parameters. This time difference helps determine the EN enable time ($T_{EN}$) for the sensing circuit. $T_{EN}$ is chosen to be between these switching times.

Figure 2A:
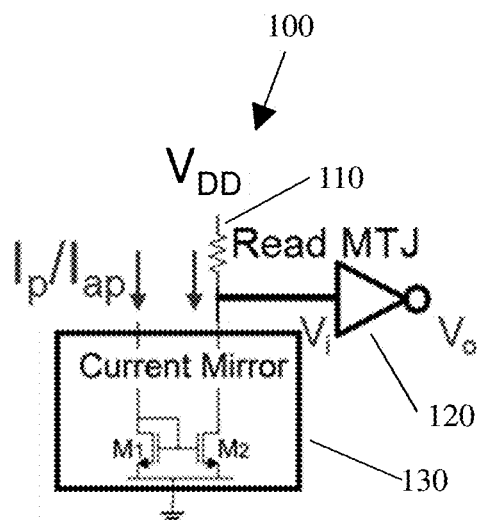
FIG. 2A shows a read MTJ circuit structure in accordance with aspects of the present disclosure.

FIG. 2A shows a read MTJ circuit structure in accordance with aspects of the present disclosure. In FIG. 2A, the read MTJ circuit structure 100 includes a read MTJ element 110 (similar to the read MTJ element 25 in FIG. 1A), an inverter 120, and a current mirror 130 (similar to the current mirror 40 in FIG. 1A). In embodiments, the current mirror 130 receives the bitline current from the bitline BL. The inverter 120 is between the read MTJ element 110 and the current mirror 130. The inverter 120 has a voltage input Vi and an output voltage Vo. As noted with the operation of the read MTJ circuit structure 100 discussed above, the read MTJ element 110 has slow switching at low current and fast switching at high current. This leads to a higher sensing margin at node Vi which can be used to sense the data stored by the memory cell easily. The sensing margin obtained at node Vi is based on equation 1 below:

$$\Delta V_i \approx (I_P * R_{AP} * R_P) \qquad \text{(equation 1)}$$

In equation 1, when the bitline current $I_{BL}$, is at the parallel state ($I_P$), the read MTJ element 110 switches its state from parallel to anti-parallel, thereby having a high resistance ($R_{AP}$) and a high current ($I_P$) passing through it, which in turn creates a low voltage at node Vi (i.e., $V_i = VDD - I_P * R_{AP}$). In contrast, when the bitline current $I_{BL}$ is at the antiparallel state ($I_P$), the current is not enough for the read MTJ element 110 to switch from parallel to anti-parallel state, thereby it has a low resistance ($R_P$) and a low current ($I_{AP}$) passing through it, which in turn creates a high voltage at node Vi (i.e., $V_i = VDD - I_{AP} * R_P$). The difference between the node voltage Vi in these two cases determines the sensing margin, which is better than conventional schemes. Therefore, sensing margin can be affected by the switching of the read MTJ element 110 and the resistance of the memory cell. In contrast, in conventional systems, the sensing margin is only dependent on the resistance of the memory cell.

Figure 2B:
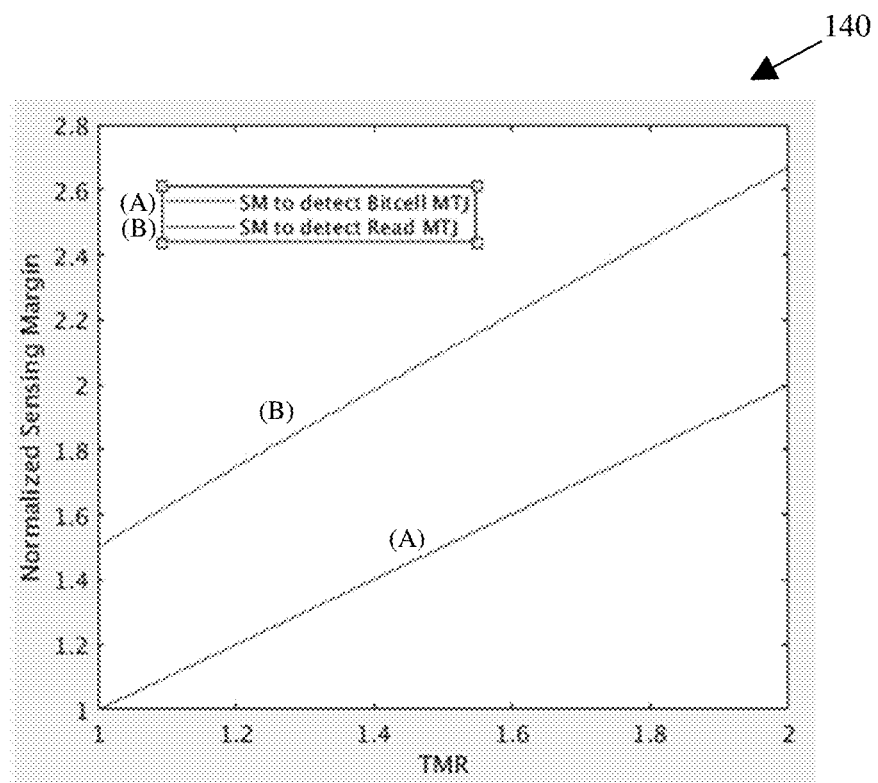
FIG. 2B shows a graph of the enhanced sensing margin enabled through the read MTJ circuit structure shown in FIG. 2A compared to conventional schemes in accordance with aspects of the present disclosure.

FIG. 2B shows a graph 140 of the read MTJ circuit structure of FIG. 2A in accordance with aspects of the present disclosure. In graph 140 of FIG. 2B, the normalized sensing margin (SM) is shown on the y-axis and the tunnel magnetoresistance (TMR) is shown on the x-axis. In the graph 140, the lower line (A) is a sensing margin (SM) which detects bitcell MTJ in conventional systems; whereas the upper line (B) is a sensing margin (SM) which detects the bitcell MTJ using the proposed read MTJ structure. In particular, at each point of the tunnel magnetoresistance (TMR) in the graph 140, the normalized sensing margin has a higher sensing margin in the upper line (B) than the lower line (A). Therefore, the upper line (B) in the graph 140 shows that there is higher sensing margin at each value of TMR in comparison to known systems.

Figure 2C:
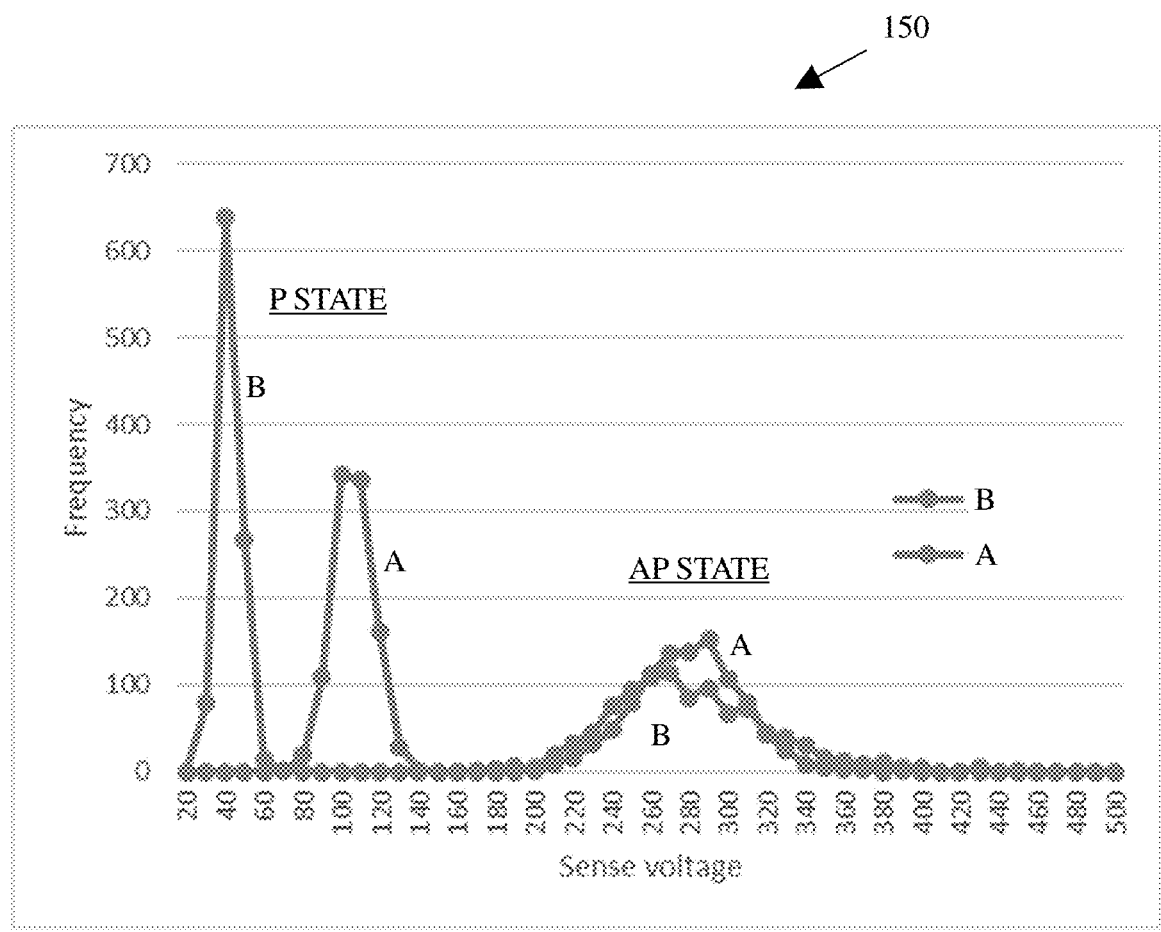
FIG. 2C shows another graph of the enhanced sensing margin enabled through the read MTJ circuit structure shown in FIG. 2A in accordance with aspects of the present disclosure.

FIG. 2C shows a graph 150 of the read MTJ circuit structure of FIG. 2A in accordance with aspects of the present disclosure. In graph 150 of FIG. 2C, a histogram of the sensing voltage is shown in presence of process variations. The frequency of occurrence is shown on the y-axis and the sense voltage is shown on the x-axis. In FIG. 2C, line (A) represents the frequency of occurrence as a function of the sense voltage for conventional systems and line (B) represents the frequency of occurrence as a function of the sense voltage for the present disclosure. In FIG. 2C, for a parallel state (i.e., P state), the frequency is much higher and at a lower sense voltage for the present disclosure (represented by line B) in comparison to conventional systems (represented by line A). For an antiparallel state (i.e., AP state), the frequency is slightly lower at about the same sense voltage for the present disclosure (line B) in comparison to conventional systems (line A). This implies that the gap between the P and AP states is much higher for the present disclosure compared to conventional systems, leading to improved sensing margin.

Figure 3:
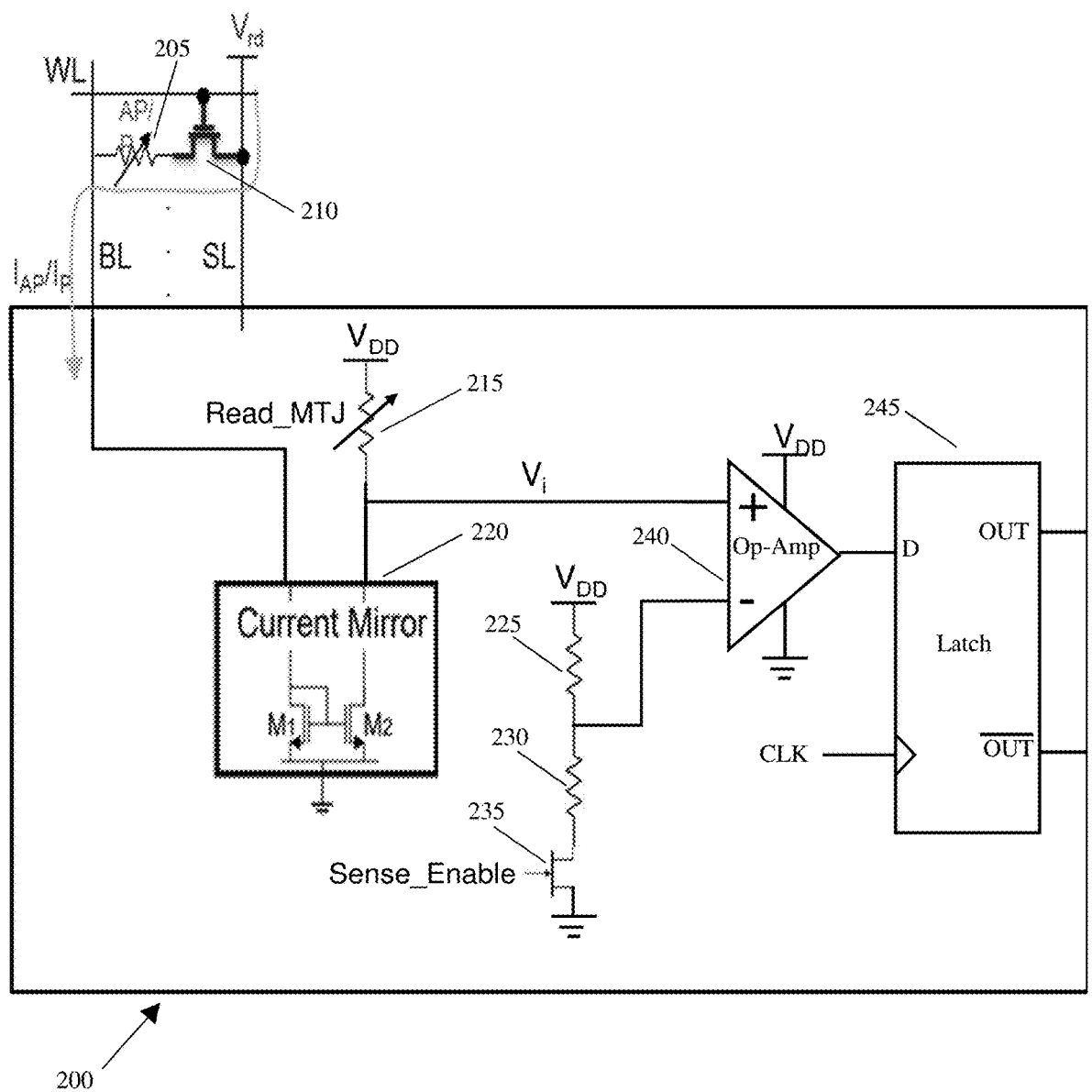
FIG. 3 shows a sensing circuit structure in accordance with aspects of the present disclosure.

FIG. 3 shows a sensing circuit structure 200 in accordance with aspects of the present disclosure. In FIG. 3, the state of the memory cell 205, which includes a bitcell for a MRAM (similar to the memory cell 15), an access transistor 210 (similar to the access transistor 20), is sensed using the sensing circuit 200. The sensing circuit structure 200 includes a read MTJ element 215 (similar to the read MTJ element 25), a current mirror 220 (similar to the current mirror 40), resistors 225, 230, a sense enable transistor 235, an operational amplifier 240, and a latch 245. The access transistor 210 is a NMOS transistor with a gate connected to a wordline WL, a drain connected to a read voltage Vrd, and a source connected to the memory cell 205. The memory cell 205 can be a magnetoresistive random access memory magnetic tunnel junction (MRAM MTJ).

The read MTJ element 215 has specific characteristics, such as slow switching during low current and fast switching during high current. The read MTJ element 215 can also be reset to a parallel state (i.e., P state) before a read cycle. Further, the read MTJ element 215 has a low energy barrier (i.e., low EB) such that the read MTJ element 215 can switch at a low read current. This allows the memory cell 205 to have an enhanced sensing margin. The read MTJ element 215 is connected between a power supply voltage VDD and the current mirror 220. The current mirror 220 receives an input from the bitline BL.

Referring still to FIG. 3, the operational amplifier 240 has a positive terminal which is connected between the read MTJ element 215 and the current mirror 220. The operational amplifier 240 has a negative terminal which is connected between the resistor 225 and the resistor 230. The sense enable transistor 235 is connected between the resistor 230 and ground. An input to the latch 245 is connected to the output terminal of the operational amplifier 240. The latch 245 outputs output signals OUT and OUT based on the input to the latch 245.

In operation of the sensing circuit structure 200 of FIG. 3, the read voltage Vrd can be applied to the access transistor 210 and the current $I_{BL}$ (which can be current from a memory cell in a parallel state ($I_P$) or an antiparallel state ($I_{AP}$) depending on the state of the memory cell 205 (e.g., MRAM MTJ)) flows through the memory cell 205 and towards the current mirror 220 (see the current direction as represented by the arrow). The current mirror 220 can replicate and pass the current $I_{BL}$ to the read MTJ element 215. The read MTJ element 215 can either switch or not switch depending on whether the current $I_{BL}$ is $I_P$ or $I_{AP}$. For example, the read MTJ element 215 switches slowly at a low current ($I_{AP}$) and switches quickly at a fast current ($I_P$).

Further, in the operation of the sensing circuit structure 200 of FIG. 3, the current $I_{BL}$ passes through the read MTJ element 215 to the current mirror 220 (i.e., the M2 transistor). The resulting voltage developed at the voltage output signal Vi is sent to a positive terminal of the operational amplifier 240. The negative terminal of the operational amplifier 240 is an output of a voltage divider (i.e., resistors 225 and 230 form a voltage divider) and will be a non-floating value when the sense enable transistor 235 is enabled (i.e., when the sense_enable signal EN is input to the gate of the sense enable transistor 235). The operational amplifier 240 takes in a value of the positive terminal and a value of the negative terminal and outputs a scaled version of a differential voltage of the value of the positive terminal and the value of the negative terminal to an input of the latch 245. The latch 245 takes in the output of the differential voltage from the operational amplifier 240 and outputs the output signal OUT (i.e., Vo) based on the differential voltage. In FIG. 3, the resistors 225, 230, a sense enable transistor 235, an operational amplifier 240, and a latch 245 can be part of a sensing circuit (similar to the sensing circuit 30). In this way, the sensing circuit structure 200 is simplified and can provide for a high sensing margin.

Figure 4:
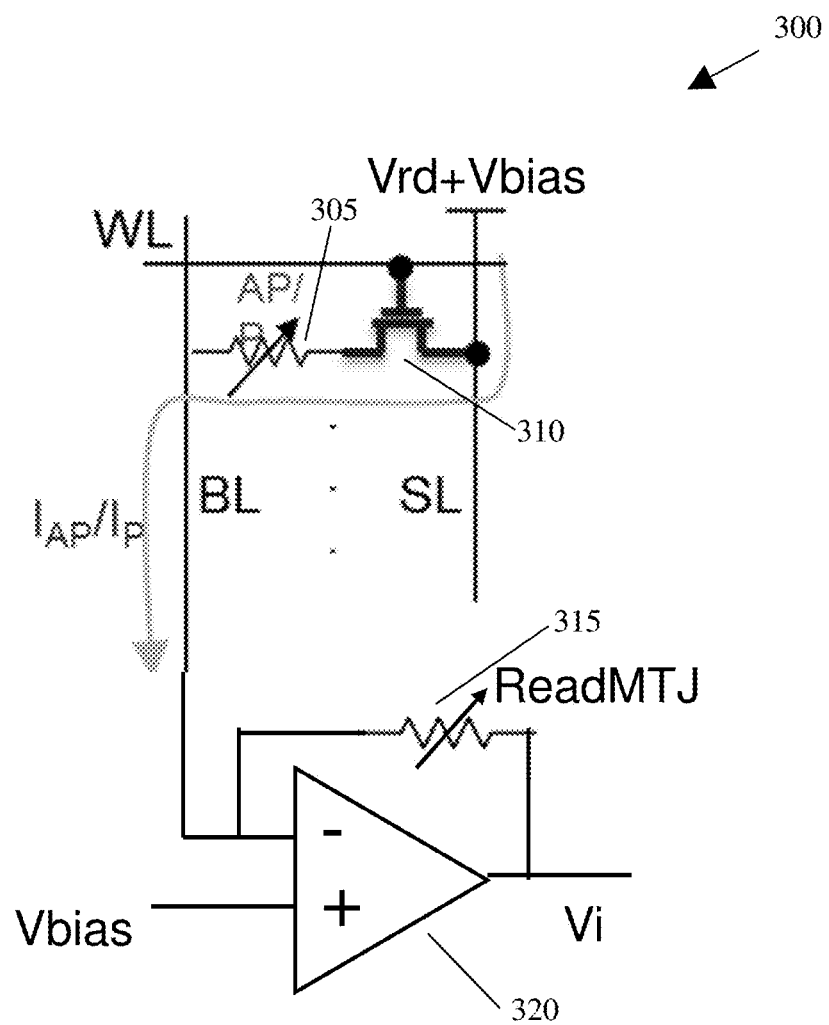
FIG. 4 shows a sensing scheme using the low-barrier read-MTJ structure in accordance with additional aspects of the present disclosure.

FIG. 4 shows a low-barrier read-MTJ structure in accordance with additional aspects of the present disclosure. In FIG. 4, the low-barrier read-MTJ structure 300 includes a memory cell 305 which includes a bitcell for a MRAM (similar to the memory cell 15), an access transistor 310 (similar to the access transistor 20), a read MTJ element 315 (similar to the read MTJ element 25), and an operational amplifier 320. In FIG. 4, the access transistor 310 is a NMOS transistor with a gate connected to a wordline WL, a drain connected to a read voltage Vrd plus a voltage bias Vbias, and a source connected to the memory cell 305. The memory cell 305 can be a magnetoresistive random access memory magnetic tunnel junction (MRAM MTJ). The read MTJ element 315 has specific characteristics, such as slow switching during low current and fast switching during high current. Further, the read MTJ element 315 can be reset to a parallel state (i.e., P state) before a read cycle. The read MTJ element 315 also has a low energy barrier (i.e., low EB) such that the read MTJ element 315 can switch at a low read current. This enables the memory cell 305 to have an enhanced sensing margin.

The read MTJ element 315 has one terminal connected to a negative input terminal of the operation amplifier 320 and another terminal connected to an output of the operation amplifier 320, which creates a feedback loop. The negative input terminal of the operational amplifier 320 also receives the bitline BL. The positive input terminal of the operational amplifier 320 receives the voltage bias Vbias and the amplifier outputs a voltage output signal Vi. As shown in FIG. 4, there is no current mirror in the low-barrier read-MTJ structure 300.

In operation of the low barrier MTJ structure of FIG. 4, a higher read voltage (Vrd+Vbias) can be applied to the access transistor 310 and the current $I_{BL}$ (which can be current from a memory cell in a parallel state ($I_P$) or an antiparallel state ($I_{AP}$) depending on the state of the memory cell 305 (e.g., MRAM MTJ)) flows through the memory cell 305 and towards the operational amplifier 320 (see the current direction as represented by the gray arrow). The read MTJ element 315 can either switch or not switch depending on whether the current $I_{BL}$ is $I_P$ or $I_{AP}$. For example, the read MTJ element 315 switches slowly at a low current ($I_{AP}$) and switches quickly at a fast current ($I_P$). Further, the operational amplifier 320 takes in the voltage bias Vbias at the positive terminal and a value of the bitline BL at the negative terminal and outputs a scaled version of a differential voltage of the voltage bias Vbias of the positive terminal and the value of the bitline BL at the negative terminal. The operational amplifier 320 outputs the voltage output signal Vi. Further, the operational amplifier 320 can give a virtual ground to allow for direct access to the read MTJ element 315 without requiring a current mirror.

In further embodiments of the present disclosure, the read MTJ element 25, the read MTJ element 110, the read MTJ element 215, and the read MTJ element 315 can be modified to create low energy barrier (Eb) magnets to enhance a sensing margin. For example, the read MTJ element 25, the read MTJ element 110, the read MTJ element 215, and the read MTJ element 315 can have a reduced cell size through modification of different lithographic processes. In an example of different lithographic processes, a blank mask and an etch can create materials with two different energy barrier (Eb) magnets. In another example of different lithographic processes, two separate lithographic processes can implement different memory cells with different cell sizes. In another modification, magnets can have a varying material or cell height. Specifically, to vary material of the magnets, the material stack itself can be modified to fabricate low energy barrier (Eb) magnets. As a non-limiting example, the material of the low energy (Eb) magnets can be Fe/MgO/FeCo, MgO, Co/MgO/Co, Fe/MgO/Fe, or $MgGa_2O_4$. However, embodiments of the present disclosure are not limited, and can be a combination of the above recited materials or different materials.

The circuit and the method for a sensing scheme for a STT-MRAM of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for a sensing scheme for a STT-MRAM of the present disclosure has been adopted from integrated circuit (IC) technology. For example, the structures are built on wafers and are realized in films of material patterned by photolithographic processes on the top of a wafer. In particular, the fabrication of the circuit and the method for a sensing scheme for a STT-MRAM uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a non-fixed read-cell circuit configured to switch from a first state to a second state based on a state of a memory cell to generate a sensing margin, wherein a positive read voltage is directly applied to a drain of an access transistor connected to the memory cell,
   wherein the non-fixed read cell-circuit is further configured to reset to a parallel state before a read cycle.

2. The structure of claim 1, wherein the non-fixed read-cell circuit is connected between a read voltage and a current mirror.

3. The structure of claim 2, wherein the current mirror is connected to the memory cell through a bitline.

4. The structure of claim 3, further comprising a sensing circuit which is connected between the non-fixed read cell-circuit and the current mirror.

5. The structure of claim 4, wherein the current mirror comprises at least two transistors.

6. The structure of claim 5, wherein the current mirror is directly connected to the memory cell through the bitline, the sensing circuit is directly connected between the non-fixed read cell-circuit and the current mirror, and the current mirror comprises at least two NMOS transistors.

7. The structure of claim 1, wherein the memory cell comprises a magnetoresistive random access memory magnetic tunnel junction (MRAM MTJ).

8. The structure of claim 1, wherein the non-fixed read-cell circuit comprises a read magnetic tunnel junction (MTJ) circuit.

9. The structure of claim 1, wherein the state of the memory cell can be one of the parallel state and an antiparallel state.

10. The structure of claim 1, wherein the non-fixed read-cell circuit comprises a low energy barrier magnet which is configured to perform slower switching at a low current and faster switching at a high current.

11. The structure of claim 1, wherein the first state is the parallel state and the second state is an antiparallel state.

12. The structure of claim 1, wherein the non-fixed read-cell circuit is configured to prevent switching when the first state is an antiparallel state and the second state is the parallel state.

13. The structure of claim 1, wherein the memory cell is directly connected to a source of the access transistor, and a gate of the access transistor is directly connected to a wordline.

14. The structure of claim 13, further comprising an operational amplifier which has a first input connected to the memory cell through a bitline and a second input connected to a voltage bias.

15. A circuit comprising a read magnetic tunnel junction (MTJ) element which has a first terminal connected to a first input of an operational amplifier and a second terminal connected to an output of the operational amplifier,
   wherein the first input of the operational amplifier is connected to a memory cell through a bitline and a second input of the operational amplifier is connected to a voltage bias.

16. The circuit of claim 15, further comprising an access transistor which is gated with a wordline connected to the memory cell, wherein the access transistor has a drain connected to a voltage supply which is a combination of a read voltage and the voltage bias and a source connected to the memory cell.

17. The circuit of claim 16, wherein the access transistor is an NMOS transistor.

18. The circuit of claim 15, wherein the first input of the operational amplifier is a negative terminal, the second input of the operational amplifier is a positive terminal, and the output of the operational amplifier is a scaled version of a differential voltage of a voltage of the positive terminal and a voltage of the negative terminal.

19. The circuit of claim 16, wherein the memory cell comprises a magnetoresistive random access memory magnetic tunnel junction (MRAM MTJ) and a bitcell.

* * * * *